United States Patent
Lee

(10) Patent No.: US 9,651,609 B2
(45) Date of Patent: May 16, 2017

(54) SEMICONDUCTOR CIRCUIT HAVING TEST FUNCTION

(71) Applicant: CESIGN CO., LTD., Seongnam-si (KR)

(72) Inventor: Soo Hyoung Lee, Hwaseong-si (KR)

(73) Assignee: CESIGN CO., LTD., Seongnam-si (KR)

( * ) Notice: Subject to any disclaimer, the term of this patent is extended or adjusted under 35 U.S.C. 154(b) by 0 days.

(21) Appl. No.: 14/762,569

(22) PCT Filed: Nov. 11, 2014

(86) PCT No.: PCT/KR2014/010781
§ 371 (c)(1),
(2) Date: Jul. 22, 2015

(87) PCT Pub. No.: WO2015/174594
PCT Pub. Date: Nov. 19, 2015

(65) Prior Publication Data
US 2017/0059646 A1  Mar. 2, 2017

(30) Foreign Application Priority Data
May 16, 2014  (KR) .................. 10-2014-0058825

(51) Int. Cl.
*G01R 31/3187* (2006.01)
*G01R 31/26* (2014.01)
(Continued)

(52) U.S. Cl.
CPC .......... *G01R 31/2644* (2013.01); *G11C 29/00* (2013.01); *G11C 29/12* (2013.01)

(58) Field of Classification Search
CPC ............ G01R 31/2884; G01R 31/3004; G01R 31/31701; G01R 31/31715;
(Continued)

(56) References Cited

U.S. PATENT DOCUMENTS 8,575,952 B2 * 11/2013 Kawasaki ........ G01R 31/31721
324/750.3
8,698,293 B2 * 4/2014 Otremba ........... H01L 23/49861
257/685
(Continued)

FOREIGN PATENT DOCUMENTS

KR  1020070024763  3/2007
KR  1020090021811  3/2009
KR  1020110001286  1/2011

OTHER PUBLICATIONS

International Search Report—PCT/KR2014/010781 dated Feb. 24, 2015.

*Primary Examiner* — Minh N Tang
(74) *Attorney, Agent, or Firm* — Cantor Colburn LLP

(57) ABSTRACT

A semiconductor circuit having a test function includes: a first circuit block including a circuit for performing a main function of the semiconductor circuit; a first power control block for controlling supply of power to the first circuit block; a second circuit block including a circuit for performing a function of testing the semiconductor circuit; and a second power control block for controlling supply of power to the second circuit block. The semiconductor circuit is operable in a first power mode in which a first pad is supplied with a supply voltage and a second pad is grounded, or in a second power mode in which the second pad is supplied with the supply voltage and the first pad is grounded. The second power control block is implemented as a diode.

8 Claims, 4 Drawing Sheets

(51) Int. Cl.
 *G11C 29/00* (2006.01)
 *G11C 29/12* (2006.01)
(58) Field of Classification Search
 CPC ............ G01R 31/31721; H01L 23/538; H01L 23/3121; H01L 23/5225; H01L 23/5385
 See application file for complete search history.

(56) References Cited

U.S. PATENT DOCUMENTS

2004/0075459 A1   4/2004  Eldridge et al.
2009/0020861 A1*  1/2009  Otremba ........... H01L 23/49805
                                                        257/676

\* cited by examiner

Prior Art

SEMICONDUCTOR CIRCUIT HAVING TEST FUNCTION

BACKGROUND OF THE INVENTION

1. Field of the Invention

The present invention generally relates to a semiconductor circuit having a test function and, more particularly, to a semiconductor circuit capable of performing a test function using only a small number of pads.

2. Description of the Prior Art

FIG. 1 is a configuration diagram showing a conventional semiconductor circuit 100 having a test function.

As can be seen in FIG. 1, the conventional semiconductor circuit 100 having a test function includes a first circuit block 110, a first power control block 120, and a second circuit block 130.

The first circuit block 110 includes a circuit for performing the main function of the semiconductor circuit 100. The first power control block 120 functions to control the supply of power to the first circuit block 110. The second circuit block 130 includes a circuit for performing a function of testing the semiconductor circuit 100, thus enabling the semiconductor circuit 100 to be tested.

More specifically, the conventional semiconductor circuit 100 having a test function is operable in a normal mode in which the first circuit block 110 is normally operated or in a test mode in which the second circuit block 130 is normally operated.

First, in the normal mode, a first pad PAD1 is supplied with a supply voltage VDD and a second pad PAD2 is grounded (GND). In this case, the operation of the second circuit block 130 is controlled in such a way that the supply of power to the second circuit block 130 is interrupted by applying a control signal through an external additional second control pad CON_PAD2 so that the supply of power to the second circuit block 130 is interrupted.

Further, in the test mode, the second pad PAD2 is supplied with the supply voltage VDD and the first pad PAD1 is grounded. In this case, the operation of the first circuit block 110 is controlled by applying a control signal through an additional first control pad CON_PAD1 so that the supply of power to the first circuit block 110 is interrupted.

That is, the conventional semiconductor circuit 100 having a test function needs the additional control pads CON_PAD1 and CON_PAD2 and the control signals in addition to the first pad PAD1 and the second pad PAD2 for power supply, and thus an additional circuit is required.

FIG. 2 is a diagram describing a pad limit.

As can be seen in FIG. 2, when the number of pads increases, the area required to arrange the pads must be secured, and thus the area S2 of a semiconductor chip increases due to such a pad limit. That is, even if the area S1 required to perform the substantial function of the semiconductor chip is small, the area S2 of the semiconductor chip increases when the number of pads increases. An increase in the semiconductor chip area S2 directly results in an increase in cost.

SUMMARY OF THE INVENTION

Accordingly, the present invention has been made keeping in mind the above problems occurring in the prior art, and an object of the present invention is to provide a semiconductor circuit having a test function, which does not require additional control pads and control signals.

Another object of the present invention is to provide a semiconductor circuit having a test function, which can suppress an increase in the area of a semiconductor chip attributable to pads, by reducing the number of pads.

A semiconductor circuit having a test function includes a first circuit block including a circuit for performing a main function of the semiconductor circuit; a first power control block for controlling supply of power to the first circuit block; a second circuit block including a circuit for performing a function of testing the semiconductor circuit; and a second power control block for controlling supply of power to the second circuit block.

The semiconductor circuit of the present invention may be operable in a first power mode in which a first pad is supplied with a supply voltage and a second pad is grounded; or in a second power mode in which the second pad is supplied with the supply voltage and the first pad is grounded, and the second power control block may be implemented as a diode. Further, the second circuit block and the diode may be connected in series between the first pad and the second pad.

In the first power mode, the first circuit block may be normally operated and the diode may be reversely biased, thus interrupting supply of power to the second circuit block.

Further, in the second power mode, the diode may be forwardly biased to supply power to the second circuit block, thus enabling the second circuit block to be normally operated.

Further, the second circuit block may interrupt the supply of power to the first circuit block by controlling the first power control block.

That is, the semiconductor circuit having a test function is operated by applying power between a first pad and a second pad, and includes a first circuit block including a circuit for performing a main function of the semiconductor circuit; a second circuit block including a circuit for performing a function of testing the semiconductor circuit; and a diode connected in series with the second circuit block.

More specifically, the diode may be operated in a forward bias or reverse bias condition depending on the power applied between the first pad and the second pad, and is configured such that, when the diode is reversely biased, the first circuit block may be normally operated, and when the diode is forwardly biased, the second circuit block may be normally operated. Further, when the diode is forwardly biased, the second circuit block may perform control such that supply of power to the first circuit block is interrupted.

In accordance with the semiconductor circuit having a test function according to the present invention, additional control pads and control signals are not required, thus suppressing an increase in the area of a semiconductor chip due to pads by reducing the number of pads.

DETAILED DESCRIPTION OF THE EXEMPLARY EMBODIMENTS

Hereinafter, a semiconductor circuit having a test function according to an embodiment of the present invention will be described in detail with reference to the attached drawings.

It is apparent that the following embodiments of the present invention are merely intended to embody the present invention and are not intended to limit or restrict the scope of the present invention. Configurations that can be easily derived by those skilled in the art to which the present invention pertains from the detailed description and embodiments of the present invention are interpreted as being included in the scope of the present invention.

Figure 1:
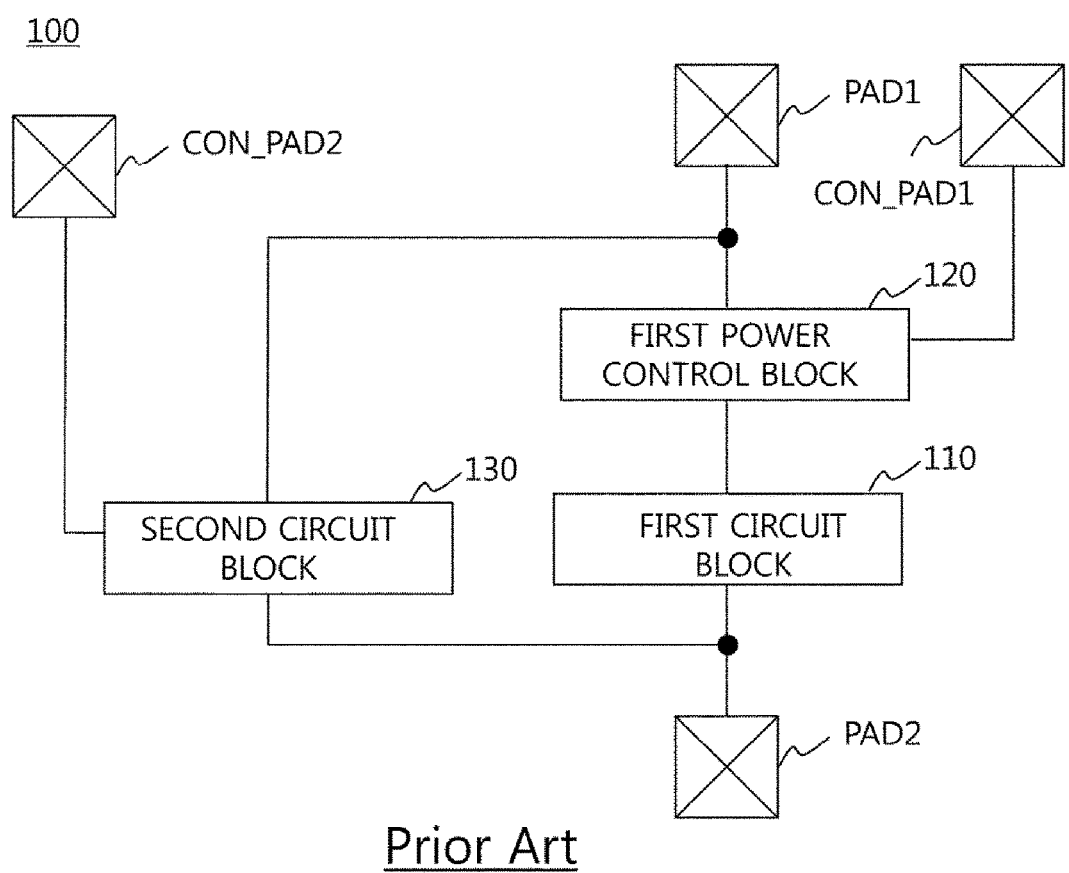
FIG. 1 is a configuration diagram showing a conventional semiconductor circuit having a test function.
Figure 2:
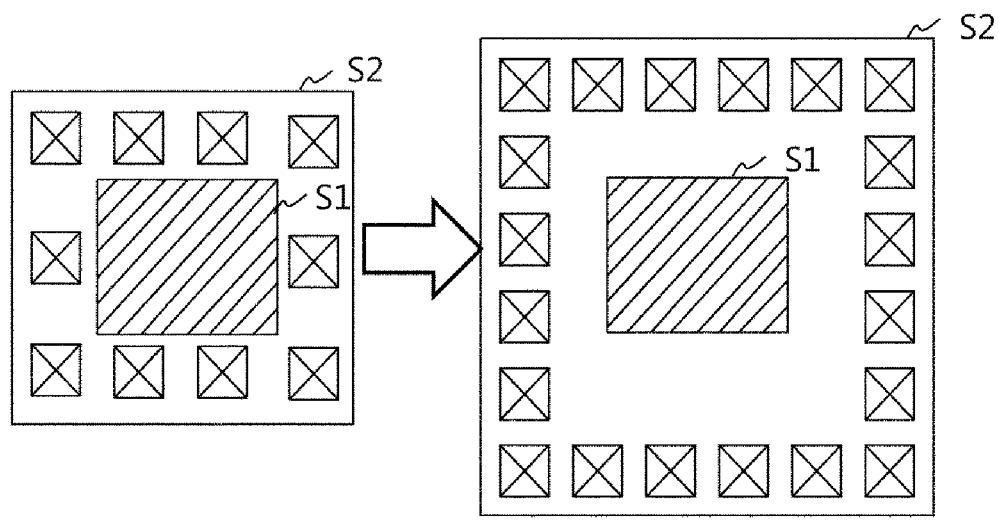
FIG. 2 is a diagram describing a pad limit.
Figure 3:
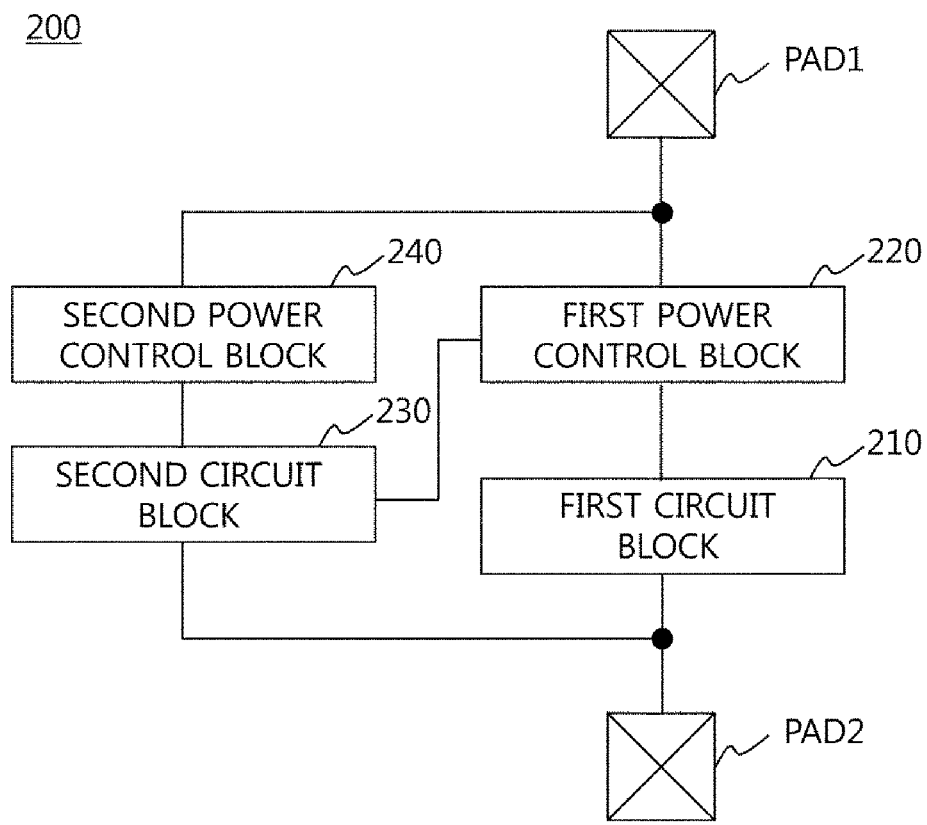
FIG. 3 is a configuration diagram showing a semiconductor circuit having a test function according to a preferred embodiment of the present invention.

FIG. 3 is a configuration diagram showing a semiconductor circuit 200 having a test function according to a preferred embodiment of the present invention.

As can be seen in FIG. 3, the semiconductor circuit 200 having a test function according to the preferred embodiment of the present invention includes a first pad PAD1, a second pad PAD2, a first circuit block 210, a first power control block 220, a second circuit block 230, and a second power control block 240.

The semiconductor circuit 200 of the present invention is configured to operate the first circuit block 210, the first power control block 220, the second circuit block 230, and the second power control block 240 by applying power between the first pad PAD1 and the second pad PAD2.

First, the first circuit block 210 includes a circuit for performing the main function of the semiconductor circuit 200. That is, the first circuit block 210 is a main function block. The first power control block 220 functions to control and manage the supply of power to the first circuit block 210. Then, the second circuit block 230 is a test function block that includes a circuit for performing a function of testing the semiconductor circuit 200. The second power control block 240 functions to control the supply of power to the second circuit block 230.

Figure 4:
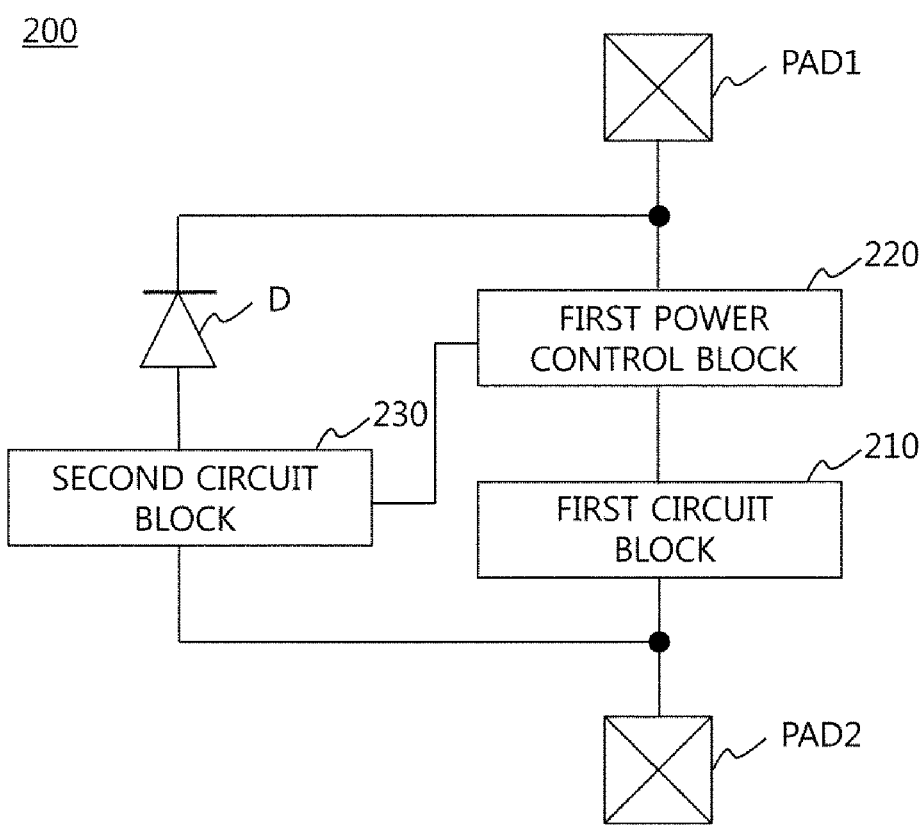
FIG. 4 is a diagram illustrating an example in which the second power control block of the semiconductor circuit of FIG. 3 is implemented as a diode.

FIG. 4 is a diagram illustrating an example in which the second power control block 240 of the semiconductor circuit 200 of FIG. 3 is implemented as a diode D. The second circuit block 230 and the diode D are connected in series between the first pad PAD1 and the second pad PAD2.

The semiconductor circuit 200 according to the present invention is operable in a first power mode in which the first pad PAD1 is supplied with a supply voltage VDD and the second pad PAD2 is grounded, or a second power mode in which the second pad PAD2 is supplied with the supply voltage VDD and the first pad PAD1 is grounded.

The first power mode is a normal mode in which the first circuit block 210 is normally operated. That is, in the first power mode, the diode D is reversely biased to interrupt the supply of power to the second circuit block 230, thus preventing the second circuit block 230 from operating. If undesirable power is supplied to the second circuit block 230 in the first power mode, the second circuit block 230 may be abnormally operated or damaged. Further, when the supply of power to the second circuit block 230 is interrupted, the flow of undesirable current is also blocked, thus preventing leakage current caused by the second circuit block 230 from flowing.

The second power mode is a test mode in which the second circuit block 230 is normally operated. That is, in the second power mode, the diode D is forwardly biased to supply power to the second circuit block 230, thus enabling the second circuit block 230 to be normally operated. Here, the second circuit block 230 preferably interrupts the supply of power to the first circuit block 210 by controlling the first power control block 220. If undesirable power is supplied to the first circuit block 210 in the second power mode, the first circuit block 210 may be abnormally operated or damaged. Further, since the supply of power to the first circuit block 210 is interrupted, the flow of undesirable current is also blocked, thus preventing leakage current caused by the first circuit block 210 from flowing.

The operation of the above-described semiconductor circuit 200 having a test function according to the preferred embodiment of the present invention may be summarized as follows.

The semiconductor circuit 200 having a test function according to the preferred embodiment of the present invention is operated by applying power between the first pad PAD1 and the second pad PAD2. However, depending on the power applied between the first pad PAD1 and the second pad PAD2, the diode D is operated in a forward bias condition or in a reverse bias condition, wherein when the diode D is reversely biased, the first circuit block 210 is normally operated, whereas when the diode D is forwardly biased, the second circuit block 230 is normally operated.

Furthermore, when the diode D is forwardly biased, the second circuit block 230 performs control so that the supply of power to the first circuit block 210 is interrupted.

As described above, the semiconductor circuit 200 having a test function according to the present invention does not require additional control pads and control signals, thus suppressing an increase in the area of a semiconductor chip attributable to pads by reducing the number of pads.

What is claimed is:

1. A semiconductor circuit having a test function, comprising:
   a first circuit block including a circuit for performing a main function of the semiconductor circuit;
   a first power control block for controlling supply of power to the first circuit block;
   a second circuit block including a circuit for performing a function of testing the semiconductor circuit; and
   a second power control block for controlling supply of power to the second circuit block,
   wherein the semiconductor circuit is operable in a first power mode in which a first pad is supplied with a supply voltage and a second pad is grounded, or in a second power mode in which the second pad is supplied with the supply voltage and the first pad is grounded;
   wherein the second power control block is implemented as a diode, the second circuit block and the diode being connected in series between the first pad and the second pad;
   wherein the first circuit block is normally operated in the first power mode; and
   wherein the semiconductor circuit is configured such that, in the first power mode, the diode is reversely biased, thus interrupting supply of power to the second circuit block.

2. The semiconductor circuit of claim 1, wherein the semiconductor circuit is operated such that, in the second power mode, the diode is forwardly biased to supply power to the second circuit block, thus enabling the second circuit block to be normally operated.

3. The semiconductor circuit of claim 2, wherein the second circuit block interrupts the supply of power to the first circuit block by controlling the first power control block.

4. A semiconductor circuit having a test function, the semiconductor circuit being operated by applying power between a first pad and a second pad, comprising:
- a first circuit block including a circuit for performing a main function of the semiconductor circuit;
- a second circuit block including a circuit for performing a function of testing the semiconductor circuit; and
- a diode connected in series with the second circuit block,
- wherein the diode is operated in a forward bias or reverse bias condition depending on the power applied between the first pad and the second pad,
- when the diode is reversely biased, the first circuit block is normally operated, and
- when the diode is forwardly biased, the second circuit block is normally operated.

5. The semiconductor circuit of claim 4, wherein when the diode is forwardly biased, the second circuit block performs control such that supply of power to the first circuit block is interrupted.

6. A semiconductor circuit having a test function, comprising:
- a first circuit block including a circuit for performing a main function of the semiconductor circuit;
- a first power control block for controlling supply of power to the first circuit block;
- a second circuit block including a circuit for performing a function of testing the semiconductor circuit; and
- a second power control block for controlling supply of power to the second circuit block,
- wherein the semiconductor circuit is operable in a first power mode in which a first pad is supplied with a supply voltage and a second pad is grounded, or in a second power mode in which the second pad is supplied with the supply voltage and the first pad is grounded;
- wherein the second power control block is implemented as a diode, the second circuit block and the diode being connected in series between the first pad and the second pad; and
- wherein the semiconductor circuit is operated such that, in the second power mode, the diode is forwardly biased to supply power to the second circuit block, thus enabling the second circuit block to be normally operated.

7. The semiconductor circuit of claim 6, wherein the semiconductor circuit is configured such that, in the first power mode, the diode is reversely biased, thus interrupting supply of power to the second circuit block.

8. The semiconductor circuit of claim 6, wherein the second circuit block interrupts the supply of power to the first circuit block by controlling the first power control block.

* * * * *